(12) United States Patent
Jiang et al.

(10) Patent No.: US 11,338,336 B2
(45) Date of Patent: May 24, 2022

(54) COATING MACHINE, COATING SYSTEM AND CLEANING METHOD FOR COATING MACHINE

(71) Applicants: Hefei Xinsheng Optoelectronics Technology Co., Ltd., Anhui (CN); BOE Technology Group Co., Ltd., Beijing (CN)

(72) Inventors: Yong Jiang, Beijing (CN); Zhiqiang Wang, Beijing (CN); Xing Tang, Beijing (CN); Shu Li, Beijing (CN); Yang Shen, Beijing (CN); Chao Gong, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 582 days.

(21) Appl. No.: 16/330,973

(22) PCT Filed: May 16, 2018

(86) PCT No.: PCT/CN2018/087122
§ 371 (c)(1),
(2) Date: Mar. 6, 2019

(87) PCT Pub. No.: WO2018/228123
PCT Pub. Date: Dec. 20, 2018

(65) Prior Publication Data
US 2021/0308729 A1    Oct. 7, 2021

(30) Foreign Application Priority Data

Jun. 12, 2017 (CN) .......................... 201710438885.7

(51) Int. Cl.
*B08B 13/00* (2006.01)
*B05C 11/00* (2006.01)
(Continued)

(52) U.S. Cl.
CPC .............. *B08B 13/00* (2013.01); *B05C 11/00* (2013.01); *B08B 1/002* (2013.01); *B08B 1/007* (2013.01);
(Continued)

(58) Field of Classification Search
None
See application file for complete search history.

(56) References Cited

U.S. PATENT DOCUMENTS 5,339,731 A * 8/1994 Howard .................... B41F 7/10
101/174
6,159,288 A 12/2000 Satou et al.
(Continued)

FOREIGN PATENT DOCUMENTS

CN 1695822 A 11/2005
CN 202124565 U 1/2012
(Continued)

OTHER PUBLICATIONS

Google Patents translation of CN 1695822, retrieved from https://patents.google.com/patent/CN1695822A/en?oq=CN+1695822+ on Sep. 24, 2021 (Year: 2021).*
(Continued)

*Primary Examiner* — Eric W Golightly
(74) *Attorney, Agent, or Firm* — Banner & Witcoff, Ltd.

(57) ABSTRACT

A coater machine, a coater system and a cleaning method of the coater machine are provided. The coater machine includes: a coating platform including a working surface;
(Continued)

and a first cleaner device configured to move relative to the working surface to remove a foreign matter on the working surface.

16 Claims, 3 Drawing Sheets

(51) Int. Cl.
    *B08B 1/00*     (2006.01)
    *B08B 1/04*     (2006.01)
    *B08B 3/02*     (2006.01)
    *G03F 7/16*     (2006.01)

(52) U.S. Cl.
    CPC ................ *B08B 1/04* (2013.01); *B08B 3/02* (2013.01); *G03F 7/16* (2013.01)

(56) References Cited

U.S. PATENT DOCUMENTS

| 2012/0080061 A1* | 4/2012 | Kim | F26B 5/08 |
|---|---|---|---|
| | | | 134/95.2 |
| 2016/0026082 A1 | 1/2016 | Chen et al. | |

FOREIGN PATENT DOCUMENTS

| CN | 202591161 U | 12/2012 |
|---|---|---|
| CN | 103521479 A | 1/2014 |
| CN | 203508454 U | 4/2014 |
| CN | 104174613 A | 12/2014 |
| CN | 104228335 A | 12/2014 |
| CN | 104549945 A | 4/2015 |
| CN | 105101774 A | 11/2015 |
| CN | 205539810 U | 8/2016 |
| CN | 205650400 U | 10/2016 |
| CN | 106186717 A | 12/2016 |
| CN | 205761985 U | 12/2016 |
| CN | 106391624 A | 2/2017 |
| CN | 106607396 A | 5/2017 |
| CN | 107199188 A | 9/2017 |
| JP | 11281461 A | 10/1999 |
| JP | 2014217826 A | 11/2014 |

OTHER PUBLICATIONS

Aug. 9, 2018—(WO) International Search Report and Written Opinion Appn PCT/CN2018/087122 with English Translation, 8 pages.
Dec. 3, 2018—(CN) First Office Action Appn 201710438885.7 with English Translation, 12 pages.
Jun. 11, 2019—(CN) Second Office Action Appn 201710438885.7 with English Translation, 16 pages.

* cited by examiner

COATING MACHINE, COATING SYSTEM AND CLEANING METHOD FOR COATING MACHINE

The application is a U.S. National Phase Entry of International Application No. PCT/CN2018/087122 filed on May 16, 2018, designating the United States of America and claiming priority to Chinese Patent Application No. 201710438885.7, filed on Jun. 12, 2017. The present application claims priority to and the benefit of the above-identified applications and the above-identified applications are incorporated by reference herein in their entirety.

TECHNICAL FIELD

At least one embodiment of the present disclosure relates to a coater machine, a coater system and a cleaning method of the coater machine.

BACKGROUND

In a field of flat panel display technology such as TFT-LCD and AM-OLED, etc., a lithography process is usually used to form various circuit patterns. In the lithography process, coating of photoresist is an important process, and a utilization rate of a coater machine is an important factor affecting a productivity of a whole factory. For the mature and stable coater machine at present, a non-utilization caused by the stability of the coater machine itself is not a most important factor affecting the utilization rate. Comparatively, a proportion of man-made shutdown caused by pollutions on a working surface of a working platform of the coater machine becomes larger and larger. The pollutions on the working surface of the working platform affect a coating process, which then causes coating defects such as Mura. In the case that foreign matters such as pollutions occur, it is necessary to shut down and clean the coater machine. This problem has a great impact on the utilization rate during the coating process.

SUMMARY

At least one embodiment of the present disclosure provides a coater machine comprising a coating platform and a first cleaner device. The coating platform comprises a working surface, and the first cleaner device is configured to move relative to the working surface to remove a foreign matter on the working surface.

For example, the coater machine provided by at least one embodiment of the present disclosure further comprises a driver device configured to drive the first cleaner device to move relative to the working surface.

For example, the coater machine provided by at least one embodiment of the present disclosure further comprises a transmission mechanism connected with the first cleaner device, and configured to be driven by the driver device so as to drive the first cleaner device to move relative to the working surface.

For example, in the coater machine provided by at least one embodiment of the present disclosure, the first cleaner device is on a side of the coating platform of the coater machine in a standby state, and is configured to be moved to the working surface in a working state.

For example, in the coater machine provided by at least one embodiment of the present disclosure, the first cleaner device is a brusher device, an air jetter device or a water washer device.

For example, in the coater machine provided by at least one embodiment of the present disclosure, the brusher device comprises a cleaning roller, and the cleaning roller comprises a cleaning surface made of a cloth material.

For example, the coater machine provided by at least one embodiment of the present disclosure further comprises a second cleaner device, the second cleaner device is on the side of the coating platform of the coater machine and is configured to clean the first cleaner device in the standby state.

For example, in the coater machine provided by at least one embodiment of the present disclosure, in the standby state, the first cleaner device is accommodated in the second cleaner device.

For example, in the coater machine provided by at least one embodiment of the present disclosure, the second cleaner device comprises at least one nozzle configured to inject a cleaning agent to a cleaning surface of the first cleaner device to clean the first cleaner device.

At least one embodiment of the present disclosure further provides a coater system comprising any one of the coater machines mentioned above and a detector device. The detector device is configured to detect a defect of a substrate coated with photoresist by the coater machine and send a detection result signal for controlling a movement of the first cleaner device of the coater machine.

For example, in the coater system provided by at least one embodiment of the present disclosure, the detector device comprises a Mura inspection machine or an automated optical inspection (AOI) machine or a macro defect inspection machine (Macro).

For example, the coater system provided by at least one embodiment of the present disclosure further comprises a controller, in which the controller is configured to be in a signal connection with the coater machine and the detector device, the detector device sends the detection result signal to the controller, and the controller controls the movement of the first cleaner device of the coater machine and controls the first cleaner device to perform a cleaning operation according to the detection result signal.

For example, in the coater system provided by at least an embodiment of the present disclosure, the detection result signal sent by the detector device to the controller comprises a position signal of the foreign matter on the working surface.

At least one embodiment of the present disclosure further provides a cleaning method of a coater machine, which is applicable to any one of the coater machines provided by the embodiments of the present disclosure, and the cleaning method comprises: detecting a defect of a substrate coated with photoresist by the coater machine; acquiring a signal of a coordinate position of the foreign matter on the working surface if it is determined that the foreign matter is on the working surface; and driving the first cleaner device to move to the coordinate position of the foreign matter to remove the foreign matter.

For example, the cleaning method of the coater machine provided by at least one embodiment of the present disclosure further comprises: before driving the first cleaner device to move to the coordinate position of the foreign matter to remove the foreign matter, driving the coater machine to switch to a stopping coating state.

For example, the cleaning method of the coater machine provided by at least one embodiment of the present disclosure further comprises: driving the coater machine to restore a coating state after the first cleaner device finishes a cleaning operation; detecting the substrate coated with photoresist after the coater machine restores the coating state, and judging whether the foreign matter is removed completely; and continuing to perform a next cleaning operation if it is judged that the foreign matter on the working surface is not removed completely, and continuing keeping the coating state if it is judged that the foreign matter on the working surface is removed completely.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

1—coating platform; 101—working surface; 102—first side surface; 103—second side surface; 201—first cleaner device; 2011—cleaning surface; 2012—roller shaft; 202—telescopic lifter mechanism; 3—second cleaner device; 301—nozzle; 302—reflow hole; 4—driver device; 5—detector device; 6—controller 10—coater machine; 100—coater system.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The figures in embodiments of the present disclosure are not drawn according to actual proportions or scales. The figures only illustrate structures of the coater machine related to the technical solutions of the embodiments of the present disclosure, and other structures may refer to the common techniques. The figures of the embodiments of the present disclosure are only schematic views.

In order to describe conveniently, pollutions, debris and other substances required to be removed in the specification are collectively referred to as "foreign matter".

In a lithography process adopted in a manufacture process of a flat display device such as a TFT-LCD display device and an OLED display device, etc., photoresist coating is generally a first step in the lithography process, and a photoresist coating effect directly affects a quality of the lithography process. Therefore, it is necessary to control a thickness, a uniformity and a surface state of the coted photoresist. In order to ensure a quality of the coted photoresist, it is required that the step of the photoresist coating is performed under a condition of high cleanliness. A coater machine is usually used to coat a surface of a substrate with photoresist, thus a working surface of the coater machine is required to be in a clean state. However, in a working process of the coater machine, some foreign matters may appear on the working surface of the coater machine. These foreign matters cause the bulging of the coated photoresist and affect the uniformity of the coated photoresist, for example, the foreign matters cause a uniform thickness of the coated photoresist, which leads to pattern defects in a follow-up development step and etching step, thus display defects of a prepared display product occur.

In view of the above problem in the manufacture process, a usual treatment is to stop the coater machine by a manual operation if an appearance defect inspection machine detects a defect of the substrate caused by the foreign matter on the working surface of the coating platform of the coater machine, and then a person enters the coater machine to confirm a position of the foreign matter, and performs a manual cleaning of the working surface of the coating platform. If a cleaning effect is not good for the first time, it may be necessary to shut down the coater machine and clean the working surface several times. Firstly, it is inconvenient and inefficient for the person to shut down the machine and restore the machine by the manual operation, enter the machine to confirm the position of the foreign matter and remove the foreign matter on the working surface by the manual operation, which results in a great loss of the utilization rate in the coating process; secondly, a risk of a secondary pollution to the working surface of the coating platform and a risk of injury of the person if the person enter the apparatus may occur.

At least one embodiment of the present disclosure provides a coater machine, and the coater machine comprises: a coating platform and a first cleaner device. The coating platform comprises a working surface, and the first cleaner device is configured to move relative to the working surface to remove a foreign matter on the working surface.

For example, the first cleaner device comprises a brusher device, or an air jetter device or a water washer device, etc. In an actual production process, the removal operation of the foreign matter on the working surface by the air jetter device such as an air gun and the water washer device such as a water gun may be combined with a hand operation. In at least one embodiment of the present disclosure, the technical solution of the present disclosure is described by taking a case where the first cleaner device is the brusher device such as a cleaning roller as an example, but it is not a limitation to the at least one embodiment of the present disclosure.

Figure 1:
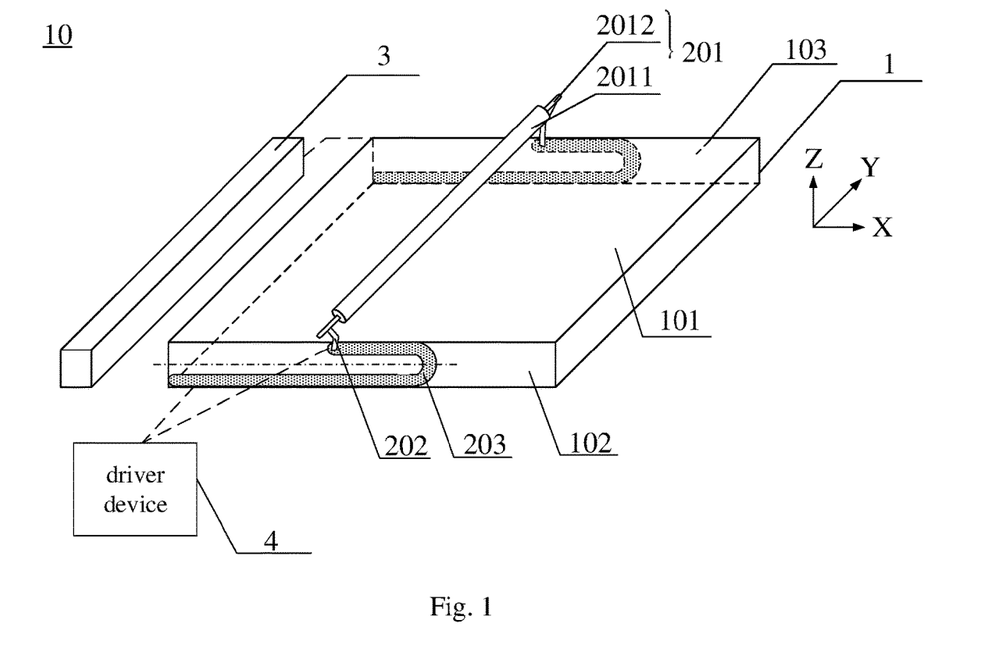
FIG. 1 is a structural schematic diagram of a coater machine provided by at least one embodiment of the present disclosure.

Exemplary, FIG. 1 is a structural schematic diagram of the coater machine provided by at least one embodiment of the present disclosure. In the embodiment illustrated in FIG. 1, the coater machine 10 comprises: the coating platform 1 and the first cleaner device 201. The coating platform 1 comprises the working surface 101. During the coater machine is working, a substrate to be processed is placed on the working surface 101 and is coated with photoresist. The photoresist for example is coated in various ways, such as a method of blade coating (curtain coating) or a method of spin coating, to form a photoresist film with a uniform thickness on a surface of the substrate. Specific structures of the coating platform is not described in detail herein and may refer to common designs.

The first cleaner device is configured to move relative to the working surface according to requirements to remove the foreign matter on the working surface, which prevents the person from entering the apparatus to remove the foreign matter on the working surface by a manual operation.

It should be noted that the first cleaner device of the coater machine provided by at least one embodiment of the present disclosure is an automatic control device rather than a manual control device. That is, the first cleaner device of the coater machine provided by at least one embodiment of the present disclosure moves under an action of driving (for example, electric driving, electromagnetic driving or hydraulic driving, etc.) to clean the working surface of the coater machine, instead of moving the first cleaner device by a manual operation to clean the working surface of the coater machine. In this way, inconvenience caused by moving the first cleaner device by the manual operation is avoided, and the secondary pollution caused by moving the first cleaner device by the manual operation is also avoided.

It should be noted that the coater machine 10 provided by at least one embodiment of the present disclosure further comprises a photoresist supplier device (for example, a photoresist nozzle), and the photoresist from the photoresist supplier device is coated on the substrate; for example, the first cleaner device is configured to be independent from the photoresist supplier device in order to drive the first cleaner device independently.

For example, in at least one embodiment of the present disclosure, the first cleaner device 201 is a cleaning roller which comprises a cleaning surface 2011 and a roller shaft. For example, the cleaning surface is a whole cylindrical surface or a portion of the cylindrical surface of a cylindrical roller body. For example, the cleaning surface is provided with a flannel cloth, a soft brush, etc.; the roller shaft 2012 extends longitudinally and is configured to drive the cylindrical roller body to rotate.

In FIG. 1, a plane shape of the working surface 101 is a rectangle is taken as an example. A length direction of the rectangle is an X direction, a width direction of the rectangle is a Y direction, and a Z direction is perpendicular to the working surface 101. After the first cleaner device 201 is moved to the working surface 101, an axial direction of the first cleaner device 201 is parallel to the width direction of the working surface 101. A length of the first cleaner device 201 is same as a width of the working surface 101. Two ends of the first cleaner device 201 are respectively located on edges, which are respectively close to a first side surface 102 and a second side surface 103, of the working surface 101.

For example, the coater machine 10 further comprises a transmission mechanism 203 connected with the first cleaner device 201 and configured to drive the first cleaner device 201 to move relative to the working surface 101. For example, the transmission mechanism 203 is respectively arranged at positions, which are respectively close to the first side surface 102 and the second side surface 103, inside the coating platform 1, and the transmission mechanism 203 is used for driving the first cleaner device 201 to move along the X direction above the working surface 101, and a moving range of the first cleaner device 201 covers the whole working surface 101. For example, the transmission mechanism 203 is directly connected to the first cleaner device 201, or connected to the first cleaner device 201 through a telescopic lifter mechanism 202. For example, the two ends of the first cleaner device 201 are respectively provided with the telescopic lifter mechanism 202, one end of each telescopic lifter mechanism 202 is connected with one end of the roller shaft 2012, and the other end of each telescopic lifter mechanism 202 is connected with the transmission mechanism 203. Thus, the telescopic lifter mechanism 202 and the first cleaner device 201 move simultaneously under being driven by the transmission mechanism 203. The telescopic lifter mechanism 202 enables the first cleaner device 201 to move in a space above the working surface 101, for example in the Z direction, so that it is convenient for the first cleaner device 201 to approach the working surface 101 in the Z direction when the first cleaner device 201 is cleaning the working surface 101 and move away from the working surface 101 in the Z direction after the first cleaner device 201 finishes the cleaning. Specific structure of the telescopic lifter mechanism may refer to a common design in the art.

As illustrated in FIG. 1, for example, the transmission mechanism 203 is at the positions, which are respectively close to the first side surface 102 and the second side surface 103, inside the coating platform 1. For example, the first side surface 102 and the second side surface 103 of the coating platform 1 are covers which are capable of being opened and closed, so that the transmission mechanism 203 is protected by the covers of the coating platform, and it is convenient to open the covers which are capable of being opened and closed for maintenance. Of course, the transmission mechanisms 203 for example is respectively provided on an outside of the first side surface 102 and an outside of the second side surface 103.

For example, in at least one embodiment of the present disclosure, the transmission mechanism 203 is a transmission chain (such as tank chain). It should be noted that the transmission mechanism 203 may be other types of mechanical transmission mechanism such as a transmission belt, or other transmission mechanisms such as an electric transmission mechanism and the like, or a composite transmission mechanism. No limitation is imposed to the specific type of the transmission mechanism in the embodiments of the present disclosure, as long as the above functions of the transmission mechanism is realized.

For example, as illustrated in FIG. 1, the coater machine 10 further comprises a driver device 4 configured to drive the first cleaner device 201 to move relative to the working surface 101. For example, the transmission mechanism 203 is configured to be driven by the driver device 4 so as to drive the first cleaner device 201 to move relative to the working surface 101. For example, the driver device 4 is further used to drive the first cleaner device 201 to rotate around the roller shaft 2012 to effectively clean the working surface. Of course, the rotation of the first cleaner device 201 may be driven by a separate driver device. For example, the driver device 4 is mechanically connected with the transmission mechanism 203, the telescopic lifter mechanism 202 and the roller shaft 2012; in this way, the transmission mechanism 203 is driven by the driver device 4 to move so that the first cleaner device 201 is driven by the transmission mechanism 203 to move along the X direction relative to the working surface 101; the telescopic lifter mechanism 202 is driven by the driver device 4 to move so that the first cleaner device 201 is driven by the telescopic lifter mechanism 202 to move in the space above the working surface 101, for example, the first cleaner device 201 is driven to move up and down along the Z direction and move along the X direction or the like; the roller shaft 2012 is driven by the driver device 4 to rotate so that the roller rotates. For example, the roller shaft 2012 is driven to rotate at a high speed by an electric motor, so as to remove the foreign matter on the working surface 101.

It should be noted that the driver device adopts a variety of driving ways, such as an electric driving, a hydraulic driving or a combination driving of a variety of driving ways. For example, the driver device comprises a motor, and a high-speed shaft coupling, a reducer, a low-speed shaft coupling and the like which are matched with the motor. As for a specific composition and a specific connection mode of the driver device, no limitation is imposed to this in the embodiments of the present disclosure. Those skilled in the art may choose a reasonable driving mode and a reasonable connection mode according to the common designs.

For example, the first cleaner device 201 is on a side of the coating platform 1 of the coater machine 10 in a standby state, and is configured to be moved to the working surface 101 in a working state. In this way, during the first cleaner device 201 is in the standby state and the coater machine 10 works normally, the first cleaner device 201 does not interfere with a normal operation on the working surface 101. The term "a side of the platform 1" refers to a position close to an edge of the coating platform 1. The standby state refers to a state in which the first cleaner device 201 does not clean the working surface; the working state refers to a process in which the first cleaner device receives an instruction of removing the foreign matter on the working surface 101, removes the foreign matter on the working surface 101 and then returns to the standby state.

For example, the coater machine 10 further comprises a second cleaner device 3, and the second cleaner device 3 is on the side of the coating platform 1 of the coater machine 10 and is configured to clean the first cleaner device 201 in the standby state. For example, the second cleaner device 3 comprises a shell, and an upper wall of the shell is a cover which is capable of being opened and closed. In the standby state, the first cleaner device 201 is accommodated in the shell; in the working state, the cover which is capable of being opened and closed is opened to form an opening on the shell, thus the first cleaner device 201 is moved out through the opening and then moved to the foreign matter on the working surface 101 to remove the foreign matter. After the cleaning for the first time, the first cleaner device 201 is moved into the second cleaner device 3 again through the opening on the shell, and the cover which is capable of being opened and closed is closed, and then the first cleaner device 201 is cleaned. In this way, the surface of the first cleaner device 201 is kept in a clean state, and a cleaning effect of the first cleaner device 201 on the working surface 101 is better.

Figure 2:
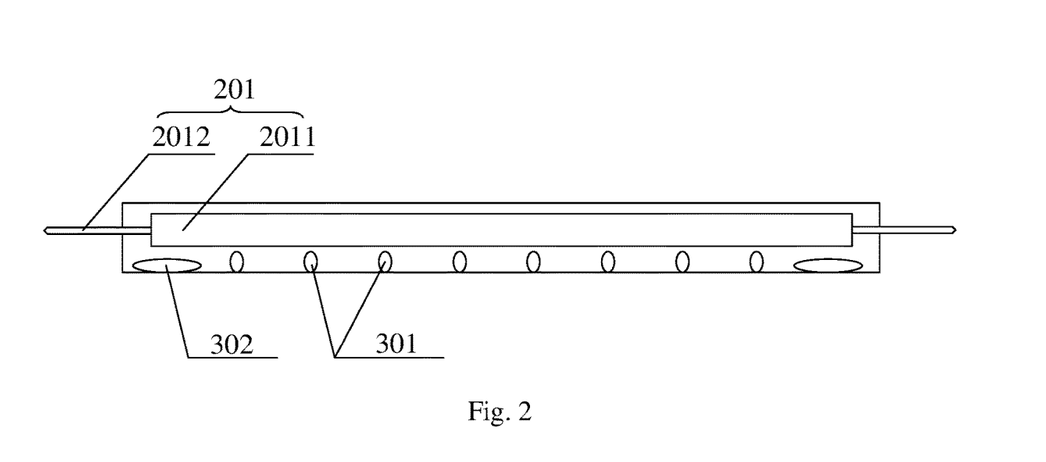
FIG. 2 is a cross-sectional schematic diagram of a second cleaner device accommodating a first cleaner device provided by at least one embodiment of the present disclosure.

In at least one embodiment of the present disclosure, the second cleaner device comprises at least one nozzle configured to inject a cleaning agent to the cleaning surface of the first cleaner device to clean the first cleaner device. For example, FIG. 2 is a cross-sectional schematic diagram of the second cleaner device accommodating the first cleaner device provided by at least one embodiment of the present disclosure. As illustrated in FIG. 2, the second cleaner device comprises at least one tubular cleaning agent container (not shown in the figure) parallel to the axial direction of the first cleaner device 201. For example, a plurality of nozzles 301 are arranged on a wall of the cleaning agent container for spraying the cleaning agent to the cleaning surface 2011 of the first cleaner device 201, and the open and close of the nozzles 301 are controlled by a solenoid valve. Two ends of the wall of the cleaning agent container are respectively provided with a reflow hole 302. A part of the cleaning agent injected through the nozzles 301 flows into the cleaning agent container again through the reflow holes 302 for a recovery treatment and reuse. For example, the plurality of nozzles 301 are evenly distributed at an equal interval, which is beneficial to achieves an effective cleaning of all parts of the cleaning surface 2011 of the first cleaner device 201. During cleaning the first cleaner device 201, the solenoid valve is opened to open the nozzles 301, and the cleaning agent is sprayed to the cleaning surface 2011 of the first cleaner device 201 through the nozzles 301, and meanwhile, the driver device 4 drives the first cleaner device 201 to rotate at a high speed while being cleaned; and the cleaning agent sprayed out is recycled through the reflow holes. The cleaning agent used herein may be an organic cleaning agent or an inorganic cleaning agent, such as alcohol, acetone, deionized water, etc.

In the coating process using the coater machine provided by at least one embodiment of the present disclosure, after the foreign matter is detected on the working surface 101 of the coater machine 10, the coater machine 10 completes the coating operation which is being performed and then is switched into a state of prohibiting a next substrate from continuing to be coated by the manual operation without shutting down the coater machine, which reduces an impact on the utilization rate and avoids a waste of photoresist in a restoration process of the coater machine; at this time, the first cleaner device 201 is in the standby state and is accommodated in the second cleaner device 3. Then, the driver device 4 is activated to make the first cleaner device 201 start the working state; the first cleaner device 201 is lifted by the telescopic lifter mechanism 202 along the Z direction with an appropriate distance, for example, the first cleaner device 201 is lifted to a position with the distance greater than or equal to 5 cm from the working surface 101; the first cleaner device 201 is moved along the X direction to a position above the foreign matter on the working surface 101 by the transmission mechanism 203, and then the first cleaner device 201 is moved down along the Z direction by the telescopic lifter mechanism 202 so that the cleaning surface 2011 contacts the working surface 101; and the first cleaner device 201 is driven by the driver device 4 for example under a manual control to rotate at a high speed to remove the foreign matter. For example, the removal operation of the foreign matter is performed for 30 seconds, the telescopic lifter mechanism 202 is driven to lift the first cleaner device 201 again, for example, the first cleaner device 201 is lifted to the position with the distance greater than or equal to 5 cm from the working surface 101 and then moved into the second cleaner device 3; the cover which is capable of being opened and closed of the second cleaner device 3 is closed, the first cleaner device 201 is cleaned. The manual operation may be used to restore the working state of the coater machine and the coater machine continue to receive the next substrate for coating.

For example, the cleaning surface 2011 of the cleaning roller is made of a cloth material. For example, the material of the cleaning surface 2011 is a ten-level dust-free cloth which is capable of being cleaned and replaced and has a better removing effect on the foreign matter on working surface 101.

The coater machine provided by at least one embodiment of the present disclosure realizes the removal of the foreign matter on the working surface by using the first cleaner device, thus prevents the person from entering the apparatus to clean the working surface manually, facilitates the cleaning operation and improves the cleaning efficiency; and it is not required to shut down the coater machine, which not only reduces the impact on the utilization rate, but also avoids the waste of photoresist in the restoration process of the coater machine.

At least one embodiment of the present disclosure further provides a coater system comprising the above-mentioned coater machine and a detector device. The detector device is configured to detect a defect of a substrate coated with photoresist by the coater machine and send a detection result signal for controlling a movement of the first cleaner device of the coater machine.

Figure 3:
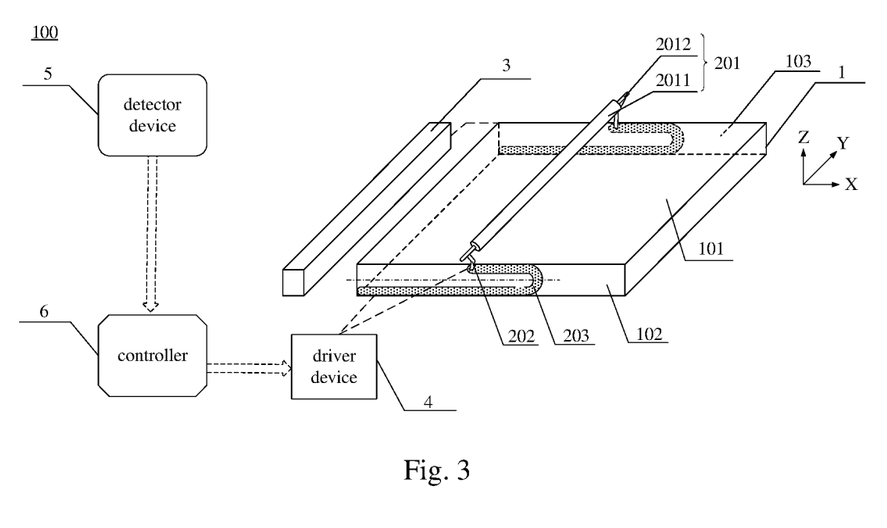
FIG. 3 is a schematic diagram of a coater system provided by at least one embodiment of the present disclosure.

Exemplary, FIG. 3 is a schematic diagram of the coater system provided by at least one embodiment of the present disclosure. As illustrated in FIG. 3, the coater system 100 comprises the above-mentioned coater machine and the detector device 5. The detector device 5 is configured to detect the defect caused by the foreign matter on the working surface of the coating platform of the coater machine and is configured to determine the position of the foreign matter on the working surface. For example, first, the defect detection of the substrate coated with photoresist by the coater machine is performed by the detector device 5. If the detection result indicates that the defect caused by the foreign matter on the working surface exits, the detector device 5 acquires a position information of the foreign matter on the working surface and sends the detection result signal for controlling the movement of the first cleaner device of the coater machine. The detection result signal comprises the position information of the foreign matter on the working surface 101 of the coater machine.

For example, the detector device 5 is connected with a data link, and the detection result signal of the detector device 5 is uploaded through the data link to control the movement of the first cleaner device of the coater machine. If the detection result indicates that no defect caused by the foreign matter on the working surface exits, the detector device 5 does not send the detection result signal. In this way, a manual determination of the position of the foreign matter on the working surface is avoided, and an automatic feedback of the detection result is realized. It is simple and convenient, and the cleaning efficiency is improved. A loss of utilization rate caused by the foreign matter on the working surface of the coater machine is reduced.

The above-mentioned detector device for example comprises a variety of inspection machines, such as a Mura inspection machine, an automated optical inspection (AOI) machine or a macro defect inspection machine (Macro), or a combination of multiple inspection machines. No limitation is imposed to the specific type of the detector device in the embodiments of the present disclosure, as long as it detects one or more foreign matters appearing on the working surface of the coater machine and provides the corresponding position information.

In the example illustrate in FIG. 3, the coater system 100 further comprises a controller 6 (such as a controller unit). The controller 6 is configured to be in a signal connection with the coater machine and the detector device 5, the detector device 5 sends the detection result signal to the controller 6, and the controller 6 controls the movement of the first cleaner device of the coater machine and controls the first cleaner device to perform the cleaning operation according to the detection result signal. For example, the detector device 5 and the controller 6 are connected by a wired means or a wireless means, and for example, the wireless means comprises WIFI, Bluetooth and the like. For example, the detector device 5 detects that the defect caused by the existence of the foreign matter on the working surface 101 of the coater machine exists, the detector device 5 first sends the detection result signal including the position signal of the foreign matter on the working surface 101 of the coater machine to the controller 6 via the data link; then, the controller 6 processes the received detection result signal and controls the driver device 4 to drive the first cleaner device 201 of the coater machine to move to the position of the foreign matter on the working surface and remove the foreign matter according to the processed detection result signal. The controller 6 for example controls the second cleaner device 3 to clean the first cleaner device after the first cleaner device 201 finishes the cleaning operation. The specific working processes of the first cleaner device 201 and the second cleaner device 3 in the embodiments of the present disclosure may refer to the above description, and no repetition herein.

In at least one embodiment of the present disclosure, the whole driving process is controlled by a control system without a manual control, thus an automatic control of the whole cleaning process is realized. This method not only avoids inconvenience of manual operations and greatly improves the efficiency of the whole cleaning process from the detection of the defect to the completion of cleaning and reduces the loss of the utilization rate, but also avoids the risk of secondary pollution and the risk of injury of the person if the person enters the apparatus.

For example, in the coater system provided by at least one embodiment of the present disclosure, after the controller 6 receives the detection result signal, the coater machine is controlled to switch to a stopping coating state first, that is, the coater machine is controlled to stop receiving the next substrate, and then the first cleaner device 201 is controlled to move to the position of the foreign matter on the working surface 101 according to the detection result signal and clean the working surface. In this way, the shutdown and restoration of the coater machine is avoided, the loss of the utilization rate is reduced, and the waste of photoresist in the restoration process is avoided.

After the coater system finishes the cleaning operation for the first time, the controller 6 controls the coater machine to restore the coating state so that the coater machine receives the next substrate and continues the coating. For example, a duration of the cleaning operation controlled by controller 6 is set by a program. After the cleaning operation, the controller 6 is automatically switched to control the coater machine to restore the coating work. After the controller 6 finishes the cleaning operation of the working surface, the working surface usually needs to be detected again after the cleaning operation. The coater system provided by at least one embodiment of the present disclosure detects a first substrate moving to the working surface by the detector device 5 after the coater machine restores the coating work. If it is detected that the foreign matter on the working surface is removed completely, the detector device 5 does not send the detection result signal, and the coater machine continues keeping the coating state; if it is detected that the foreign matter on the working surface is not removed completely, the detection result signal is sent to the controller. The controller controls the coater machine to switch to the state of stopping the coating work and perform a next cleaning operation until the working surface is clean. In the usual manner that the coater machine is manually controlled to shut down and the person needs to enter the apparatus and clean the working surface manually, if it is found that one cleaning is not enough by the defect detection, the step in which the coater machine is manually controlled to shut down and the person enters the apparatus and cleans the working surface should be repeated. The coater system provided by at least one embodiment of the present disclosure realizes the automatic control of the whole cleaning process, which is simple, convenient and greatly reduces the loss of the utilization rate caused by the above-described repeated shutdown and manual cleaning.

In the embodiments of the present disclosure, the controller may be configured and used in a variety of ways. For example, the controller is a special purpose computer device such as a digital signal processor (DSP), a programmable logic controller (PLC) and the like, or a general purpose computer device such as a central processing unit (CPU) and the like. The controller may adopt a variety of configurations. For example, the controller is electrically connected with the driver device of the coater machine, or the controller is arranged inside the coater machine and the controller is controlled by a program to realize the above-mentioned control of the coater machine. No limitation is imposed to the type and configuration of the controller in the embodiments of the present disclosure, and those skilled in the art may reasonably design the controllers according to requirements of a specific product.

At least one embodiment of the present disclosure further provides a cleaning method of a coater machine, which is applicable to any one of the coater machines provided by the embodiments of the present disclosure, and the cleaning method comprises: detecting a defect of a substrate coated with photoresist by the coater machine; acquiring a signal of a coordinate position of the foreign matter on the working surface if it is determined that the foreign matter is on the working surface; and driving the first cleaner device to move to the coordinate position of the foreign matter to remove the foreign matter.

For example, in the cleaning method of the coater machine provided by at least one embodiment of the present disclosure, before driving the first cleaner device to move to the coordinate position of the foreign matter to remove the foreign matter, the coater machine is driven to switch to a stopping coating state.

For example, in the cleaning method of the coater machine provided by at least one embodiment of the present disclosure, the coater machine is driven to restore a coating state after the first cleaner device finishes the cleaning operation; the substrate coated with photoresist after the coater machine restores the coating state is detected to judge whether the foreign matter is removed completely; a next cleaning operation is performed if it is judged that the foreign matter on the working surface is not removed completely; and the coating state is kept if it is judged that the foreign matter on the working surface is removed completely.

It should be noted that the term "the first cleaner device finishes the cleaning operation" refers to that the first cleaner device finishes the cleaning at the position of the foreign matter on the working surface and returns into the second cleaner device.

Figure 4:
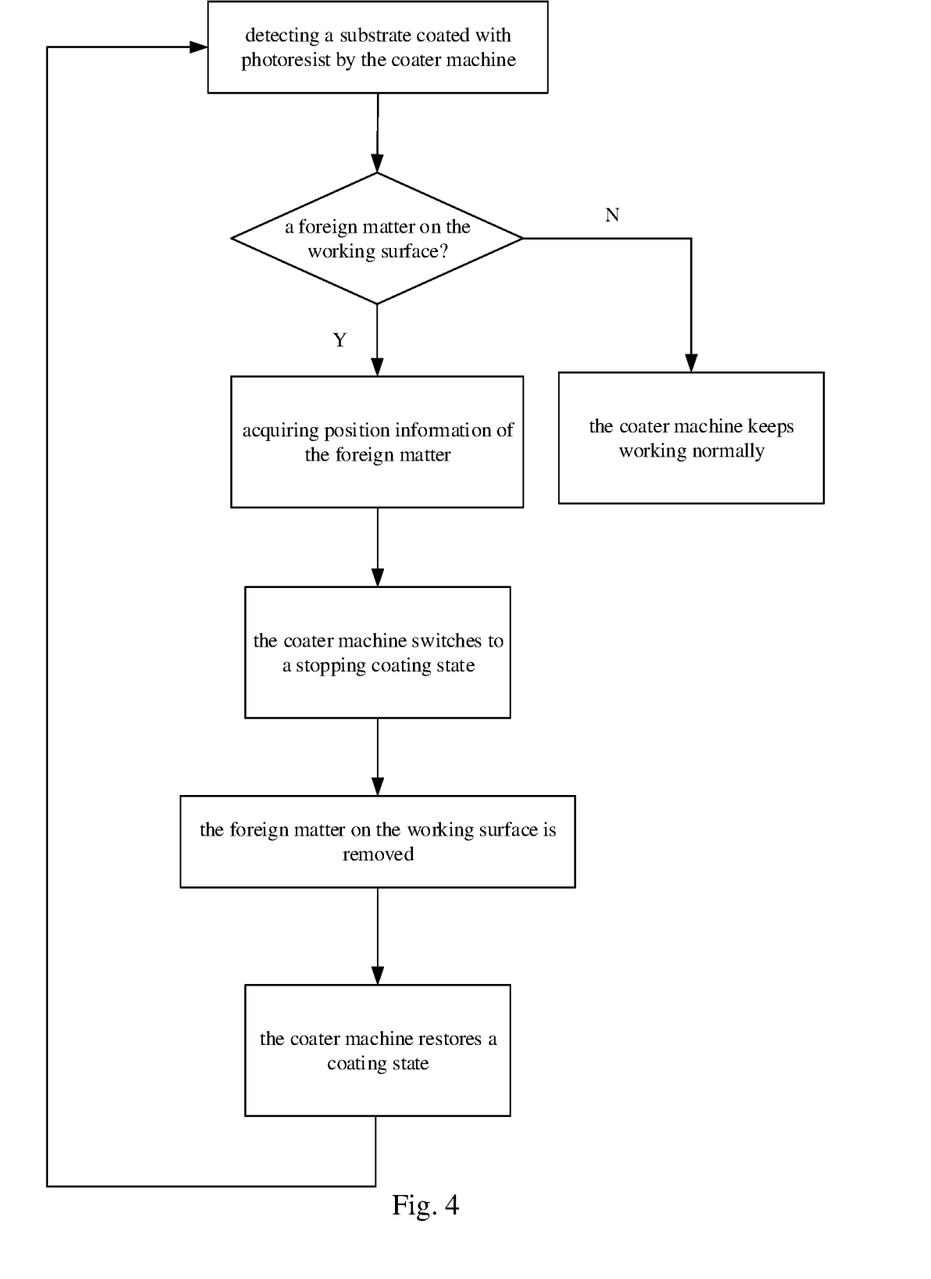
FIG. 4 is a brief flow diagram of a cleaning method of the coater machine provided by at least one embodiment of the present disclosure.

For example, FIG. 4 is a brief flow diagram of the cleaning method of the coater machine provided by at least one embodiment of the present disclosure. As illustrated in FIG. 4, the cleaning method of the coater machine comprises the following steps.

Step 1, the defect of the substrate coated with the photoresist by the coater machine is detected by the detector device to judge whether the defect caused by the foreign matter on the working surface of the coater machine exits, thus to judge whether the foreign matter exits on the working surface.

If a detection result indicates that the defect caused by the foreign matter on the working surface exits, the detector device acquires the position information of the foreign matter on the working surface and sends a detection result signal to the controller. For example, the detector device is connected with the controller through a data link, and the detector device sends the detection result signal to the controller through the data link. If the detection result indicates that no foreign matter exits on the working surface, the detector device does not send the detection result signal, and the coater machine keeps working normally.

Step 2, after the controller receives the detection result signal, the coater machine is controlled to switch to a stopping coating state first, for example, the coater machine is controlled to stop receiving the next substrate, so that a waste caused by a continuation of coating before the cleaning is finished is avoided, and it is not required to stop the coater machine, which avoids a great impact on the utilization rate caused by the process of stopping and restoring the coater machine. Then the driver device of the coater machine is controlled to drive the first cleaner device to move to the position of the foreign matter on the working surface and perform a first cleaning operation. After the first cleaning operation is finished, the first cleaner device returns to the second cleaner device and is cleaned in the second cleaner device, and the specific processes in which the driver device drives the first cleaner device and the second cleaner device to perform the first cleaning operation may refer to the description in the above embodiments and no repetition is provided herein.

It should be noted that the defect detection of the substrate coated with the photoresist by the detector device is performed in real time. If it is determined that the foreign matter exits on the working surface of the coater machine, the controller receives the detection result signal and controls the coater machine to switch to the state of stopping receiving the next substrate, at this time, if the coating of the substrate being coated on the working surface is not finished, the controller controls the driver device to drive the first cleaner device to perform the cleaning operation after the coater machine finishes the coating of the substrate being coated on the working surface.

Step 3 after the first cleaning operation is finished, the controller controls the coater machine to restore the coating work, and the coater machine continues to receive the next substrate to be coated.

Step 4, the working surface is detected after the first cleaning operation, that is, a first substrate coated with photoresist after the coater machine restores the coating work is detected by the detector device to determine whether the defect caused by the foreign matter still exists on the working surface of the coater machine, so as to judge whether the foreign matter is removed completely. If it is judged that the foreign matter on the working surface is removed completely, the coater machine continues keeping the coating state; if it is judged that the foreign matter on the working surface is not removed completely, the coater machine performs the next cleaning operation, that is, the above step 1 to step 3 are performed and then the step 4 is repeated until the foreign matter on the working surface is removed completely.

It should be noted that in order to avoid some situations where the foreign matter is not removed completely after repeated cleaning operations, for example, the detection result still indicates that the foreign matter on the working surface is not removed completely after three consecutive cleaning operations, then manual interventions may be carried out.

The cleaning method of the coater machine provided by at least one embodiment of the present disclosure realizes the automatic control of the whole cleaning process, but manual interventions may be introduced according to specific situations. Compared with a common cleaning method, the cleaning method provided by at least one embodiment of the present disclosure not only avoids the inconvenience of manual operations, stopping an restoring of the coater machine, greatly improves the efficiency of the whole cleaning process and reduces the loss of the utilization rate, but also avoids the risk of secondary pollution and the risk of injury of the person if the person enters the apparatus.

What have been described above are only specific implementations of the present disclosure, the protection scope of the present disclosure is not limited thereto. The protection scope of the present disclosure should be based on the protection scope of the claims.

What is claimed is:

1. A coater machine comprising:
    a coating platform comprising a working surface;
    a first cleaner device configured to move relative to the working surface to remove a foreign matter on the working surface; and
    a telescopic lifter mechanism, wherein two ends of the first cleaner device are respectively provided with the telescopic lifter mechanism, and the telescopic lifter mechanism is configured to drive the first cleaner device to move in a direction perpendicular to the working surface.

2. The coater machine according to claim 1, further comprising a driver device configured to drive the first cleaner device and the telescopic lifter mechanism to move relative to the working surface.

3. The coater machine according to claim 2, further comprising a transmission mechanism connected with the first cleaner device by the telescopic lifter mechanism, and configured to be driven by the driver device so as to drive the first cleaner device and the telescopic lifter mechanism to move relative to the working surface.

4. The coater machine according to claim 1, wherein the first cleaner device is on a side of the coating platform in a standby state, and is configured to be moved to the working surface in a working state.

5. The coater machine according to claim 1, wherein the first cleaner device is a brusher device, an air jetter device or a water washer device.

6. The coater machine according to claim 5, wherein the brusher device comprises a cleaning roller, the cleaning roller comprises a roller shaft and a cleaning surface made of a cloth material, and the cleaning roller rotates around the roller shaft while moving relative to the working surface.

7. The coater machine according to claim 4, further comprising a second cleaner device, wherein the second cleaner device is on the side of the coating platform and is configured to clean the first cleaner device in the standby state.

8. The coater machine according to claim 7, wherein in the standby state, the first cleaner device is accommodated in the second cleaner device.

9. The coater machine according to claim 7, wherein the second cleaner device comprises at least one nozzle configured to inject a cleaning agent to a cleaning surface of the first cleaner device to clean the first cleaner device, and the second cleaner device further comprises a reflow hole for recycling the cleaning agent.

10. A coater system comprising:
    the coater machine according to claim 1; and
    a detector device configured to detect a defect of a substrate coated with photoresist by the coater machine and send a detection result signal for controlling a movement of the first cleaner device.

11. The coater system according to claim 10, wherein the detector device comprises a Mura inspection machine or an automated optical inspection machine or a macro defect inspection machine.

12. The coater system according to claim 10, further comprising a controller, wherein the controller is configured to be in a signal connection with the coater machine and the detector device, the detector device sends the detection result signal to the controller, and the controller controls the movement of the first cleaner device and controls the first cleaner device to perform a cleaning operation according to the detection result signal.

13. The coater system according to claim 12, wherein the detection result signal comprises a position signal of the foreign matter on the working surface.

14. A cleaning method of a coater machine, the method comprising:
    detecting a defect of a substrate coated with photoresist by the coater machine;
    acquiring a signal of a coordinate position of a foreign matter on a working surface if it is determined that the foreign matter is on the working surface; and
    driving a first cleaner device to move to the coordinate position of the foreign matter to remove the foreign matter, wherein the coater machine comprises: a coating platform comprising the working surface; the first cleaner device configured to move relative to the working surface to remove the foreign matter on the working surface; and a telescopic lifter mechanism, wherein two ends of the first cleaner device are respectively provided with the telescopic lifter mechanism, and the telescopic lifter mechanism is configured to drive the first cleaner device to move in a direction perpendicular to the working surface.

15. The cleaning method of the coater machine according to claim 14, further comprising:
    before the driving the first cleaner device to move to the coordinate position of the foreign matter to remove the foreign matter, driving the coater machine to switch to a stopping coating state.

16. The cleaning method of the coater machine according to claim 15, further comprising:
    driving the coater machine to restore a coating state after the first cleaner device finishes a cleaning operation;
    detecting the substrate coated with photoresist after the coater machine restores the coating state, and judging whether the foreign matter is removed completely; and continuing to perform a next cleaning operation if it is judged that the foreign matter on the working surface is not removed completely, and continuing keeping the coating state if it is judged that the foreign matter on the working surface is removed completely.

* * * * *